US009900009B2

(12) United States Patent
Akahane

(10) Patent No.: US 9,900,009 B2
(45) Date of Patent: Feb. 20, 2018

(54) LEVEL SHIFT CIRCUIT

(71) Applicant: Fuji Electric Co., Ltd., Kawasaki-shi (JP)

(72) Inventor: Masashi Akahane, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 15/301,219

(22) PCT Filed: Aug. 25, 2015

(86) PCT No.: PCT/JP2015/004261
§ 371 (c)(1),
(2) Date: Sep. 30, 2016

(87) PCT Pub. No.: WO2016/051655
PCT Pub. Date: Apr. 7, 2016

(65) Prior Publication Data
US 2017/0019106 A1    Jan. 19, 2017

(30) Foreign Application Priority Data
Oct. 1, 2014  (JP) ................................. 2014-203293

(51) Int. Cl.
*H03L 5/00* (2006.01)
*H03K 19/0185* (2006.01)
(Continued)

(52) U.S. Cl.
CPC ... *H03K 19/018507* (2013.01); *H03K 17/162* (2013.01); *H03K 17/687* (2013.01);
(Continued)

(58) Field of Classification Search
CPC ................. H03K 17/16; H03K 17/687; H03K 19/018507; H03K 19/0185; H03K 2217/0063; H03K 2217/0072
(Continued)

(56) References Cited

U.S. PATENT DOCUMENTS 5,917,359 A * 6/1999 Fukunaga ............ H03K 3/0375
327/18
6,529,061 B1 * 3/2003 Orita .................... H03K 17/162
327/112
(Continued)

FOREIGN PATENT DOCUMENTS

JP          3429937 B2    7/2003
JP      2009-124725 A    6/2009
(Continued)

OTHER PUBLICATIONS

International Search Report in International Application No. PCT/JP2015/004261, dated Oct. 6 2015.

*Primary Examiner* — Ryan Jager
(74) *Attorney, Agent, or Firm* — Venable LLP; Michael A. Sartori; Laura G. Remus

(57) ABSTRACT

The present invention provides a level-shift circuit that can suppress the malfunction caused by the noise due to the ON/OFF of a level-shift transistor and the dV/dt noise due to external noise. The present invention provides a level-shift circuit for transmitting a signal from a primary potential side to a secondary potential side, comprising: a first serial circuit a first resistance including serially-connected to a first switching element; a second serial circuit including a second resistance serially-connected to a second switching element; a latch malfunction protection circuit for which the respective output terminals of the first and second serial circuits are connected to an input terminal; a latch circuit for receiving a signal outputted from the latch malfunction (Continued)

protection circuit; and a capacitor connected between drain terminals of the first resistance and the first switching element and between drain terminals of the second resistance and the second switching element.

3 Claims, 9 Drawing Sheets

(51) Int. Cl.
 *H03K 17/687* (2006.01)
 *H03K 17/16* (2006.01)
 *H03K 19/003* (2006.01)

(52) U.S. Cl.
 CPC . *H03K 19/00361* (2013.01); *H03K 19/00369* (2013.01); *H03K 2217/0063* (2013.01); *H03K 2217/0072* (2013.01)

(58) Field of Classification Search
 USPC ...................................... 327/333; 326/80, 81
 See application file for complete search history.

(56) References Cited

U.S. PATENT DOCUMENTS

| | | | |
|---|---|---|---|
| 6,812,763 B1* | 11/2004 | Lin .................. | H03D 7/1441 327/238 |
| 7,495,482 B2* | 2/2009 | Sakai .................. | H02M 1/08 327/108 |
| 7,782,115 B2* | 8/2010 | Ochi .................... | H03F 3/2173 326/68 |
| 8,253,472 B2 | 8/2012 | Nishijima et al. | |
| 8,766,696 B2* | 7/2014 | Gazit ............. | H03K 19/018521 326/80 |
| 8,975,944 B2 | 3/2015 | Akahane | |
| 9,294,093 B2 | 3/2016 | Akahane | |
| 9,312,845 B2* | 4/2016 | Akahane .................. | H03K 7/08 |
| 2011/0043269 A1* | 2/2011 | Nishijima ...... | H03K 19/018521 327/333 |
| 2011/0134710 A1* | 6/2011 | Akahane ........ | H03K 19/018521 365/189.11 |
| 2012/0081149 A1* | 4/2012 | Akahane ........ | H03K 19/018521 326/81 |
| 2013/0278319 A1* | 10/2013 | Akahane .......... | H03K 3/356182 327/333 |
| 2013/0293247 A1* | 11/2013 | Akahane ................ | H03K 17/56 324/705 |
| 2014/0253236 A1* | 9/2014 | Cheeranthodi ......... | H03F 1/086 330/260 |
| 2014/0292392 A1* | 10/2014 | Akahane .......... | H03K 17/04123 327/333 |
| 2015/0137852 A1 | 5/2015 | Akahane | |
| 2015/0303811 A1* | 10/2015 | Akahane ........ | H03K 19/018521 323/311 |
| 2017/0019106 A1* | 1/2017 | Akahane ................ | H03K 17/16 |

FOREIGN PATENT DOCUMENTS

| | | |
|---|---|---|
| JP | 2011-044770 A | 3/2011 |
| JP | 2012-004786 A | 1/2012 |
| JP | 2013-183422 A | 9/2013 |
| WO | WO-2012/070174 A1 | 5/2012 |

* cited by examiner

LEVEL SHIFT CIRCUIT

TECHNICAL FIELD

The present invention relates to a level-shift circuit to prevent the malfunction due to dV/dt noise.

BACKGROUND ART

The control for an industrial motor or a server power source for example is performed by driving half-bridge connection semiconductor devices. As an IC for driving these semiconductor devices, there is an HVIC (High Voltage IC). The use of the HVIC allows both of an upper level-side semiconductor device and a lower level-side semiconductor device of a half-bridge circuit driven by a high potential power source to be driven by one IC. The HVIC receives a control signal of a microcomputer for example to output a signal for driving the semiconductor device. The HVIC includes therein a level-shift circuit in order to drive the upper level-side semiconductor device in particular by a low potential signal.

The HVIC includes therein a level up shift circuit for transmitting a signal from the low side to the high side and a level down shift circuit for transmitting a signal from the high side to the low side. Generally, a level up shift circuit uses an N channel-type semiconductor switching element and a level down shift circuit uses a P channel-type semiconductor switching element. When a half-bridge circuit is switched, a reference potential of a high side region changes from a low potential to a high potential or from a high potential to a low potential.

FIG. 1 illustrates a circuit configuration using a conventional level-shift circuit disclosed in Patent Literature 1. FIG. 1 illustrates a circuit including an output circuit 10 including a high potential-side switching element 11 and a low potential-side switching element 12, a high potential-side driving circuit 20, and a low potential-side driving circuit 30. The high potential-side driving circuit 20 is connected to a gate terminal of the high potential-side switching element 11 of the output circuit 10. The low potential-side driving circuit 30 is connected to the gate terminal of the low potential-side switching element 12 of the output circuit 10.

The output circuit 10 is composed of the high potential-side switching element 11 and the low potential-side switching element 12 that are serially connected. A high voltage power source 13 supplies electric power to a load 14 via the high potential-side switching element 11. The load 14 is a load that receives the supply of a voltage (electric power) from the half-bridge circuit. The load 14 is connected between the connecting point Vs of the high potential-side switching element 11 and the low potential-side switching element 12 (the potential of the connecting point Vs is also represented by the connecting point Vs) and a grounding potential.

The high potential-side switching element 11 and the low potential-side switching element 12 are turned ON/OFF in a complementary manner so that one is ON and the other is OFF except for a dead time during which the former and the latter are both OFF. When the low potential-side switching element 12 is ON, the potential of the connecting point Vs is a grounding potential and, when the high potential-side switching element 11 is ON, the potential of the connecting point Vs is the output voltage of the power source 13.

The high potential-side driving circuit 20 includes a latch malfunction protection circuit 21, a latch circuit 22, a high side driver 23, a power source 24, resistances R1 and R2, level-shift transistors 25 and 26, and diodes D1 and D2. The latch malfunction protection circuit 21, the latch circuit 22, the high side driver 23, and the low potential-side power source terminal of the power source 24 are connected to the connecting point Vs.

The input of the gate of the level-shift transistor 25 is a set signal that is an input signal to the level-shift circuit of the high potential-side driving circuit 20. The input of the gate of a level-shift transistor 26 is a reset signal that is an input signal to the level-shift circuit of the high potential-side driving circuit 20. The set signal is a signal that instructs the timing at which the ON period of the high potential-side switching element 11 is started (or the OFF period is ended). The reset signal is a signal that instructs the timing at which the OFF period of the low potential-side switching element 12 is started (or the ON period is ended). The set signal and the reset signal are pulse input signals that are not turned ON simultaneously. The level-shift transistors 25 and 26 can use an N channel-type semiconductor switching element.

The input of latch malfunction protection circuit 21 is level-shift output signals setdrn (hereinafter referred to as a setdrn signal) and resdrn (hereinafter referred to as a resdrn signal). When there is a change in the potential of the connecting point Vs, an error signal is caused that is called a dv/dt noise due to the parasitic capacitances Cds1 and Cds2 for example between the source and drain of the level-shift transistors 25 and 26. Then, the setdrn signal and the resdrn signal both have an H level or an L level, undesirably causing the set instruction and the reset instruction to the latch circuit 22 to be valid. In this case, the latch malfunction protection circuit 21 is a circuit to prevent the setdrn signal and the resdrn signal from being directly transmitted to the latch circuit 22 by causing the output to have a high impedance for example. The latch malfunction protection circuit 21 is a circuit that functions, when there is no dv/dt noise, to allow the setdrn signal and the resdrn signal to be directly passed and output and, when there is a dv/dt noise, to output a signal processed based on the setdrn signal and the resdrn signal (by setting one output signal to allow the signal to have an H level when the setdrn signal and the resdrn signal are the ones to set the latch circuit 22 or to allow the output to have a high impedance when the setdrn signal and the resdrn signal are the ones to reset the latch circuit 22 for example) or to block the passage of the setdrn signal and the resdrn signal.

The input of the latch circuit 22 is an input signal from the latch malfunction protection circuit 21 and stores therein a value set or reset depending on whether the input signal is L or H to output the value. When the input has a high impedance, the latch circuit 22 retains and outputs a value stored immediately before when the input had the high impedance.

The output terminal of the high side driver 23 is connected to the gate terminal of the high potential-side switching element 11. The output terminal of the high side driver 23 outputs a signal HO depending on the output of the latch circuit 22 to control the ON/OFF of the high potential-side switching element 11.

The diodes D1 and D2 have anodes connected to the connecting point Vs. The cathode of the diode D1 is connected to the connecting point Vsetb. The cathode of the diode D2 is connected to the connecting point Vrstb. The diodes D1 and D2 function to clamp the voltages Vsetb and Vrstb so that the voltages Vsetb and Vrstb are prevented from being equal to or lower than the potential Vs and to protect the latch malfunction protection circuit 21 so that the latch malfunction protection circuit 21 does not receive an overvoltage.

The low potential-side driving circuit 30 includes a low side driver 31 that controls the ON/OFF of the low potential-side switching element 12 and a power source 32 that supplies a power source to the low side driver 31. The low side driver 31 amplifies the signal S that instructs the ON/OFF of the low potential-side switching element 12 to output the signal S to the gate terminal of the low potential-side switching element 12. As a result, the low potential-side driving circuit 30 turns ON the low potential-side switching element 12 when the signal S inputted to the low side driver 31 has a H (High) level and turns OFF the low potential-side switching element 12 when the signal S has an L (Low) level.

FIG. 2 illustrates a conventional level-shift circuit disclosed in Patent Literature 2. The level-shift circuit shown in FIG. 2 is different from the level-shift circuit shown in FIG. 1 mainly in a malfunction prevention circuit and a latch circuit provided at the high side.

CITATION LIST

Patent Literature

PTL 1: Japanese Patent No. 3429937
PTL 2: Japanese Patent Laid-Open No. 2011-044770

SUMMARY OF INVENTION

Technical Problem

In accordance with a switching operation of a half-bridge circuit, a level-shift circuit has a phenomenon of so-called dV/dt noise caused when the potential Vs of the connecting point Vs as a reference potential of the high side circuit rapidly changes from a low potential to a high potential or from a high potential to a low potential to thereby cause a change of a part (or the entirety) of the high side circuit to the reference voltage Vs. The level-shift circuit had a possibility where the influence of this dV/dt noise may cause the output of the high side circuit to have a malfunction (logic inversion). Factors causing the tendency of a malfunction due to the generated dV/dt noise include a variation of elements of device constituting the circuit in particular. Specifically, the existence of the element variation causes a different kind of an output of the dV/dt noise in the setdrn signal and the resdrn signal. Thus, when the latch malfunction protection circuit 21 includes therein dV/dt noise, there is no more assumption that the setdrn signal and the resdrn signal both have an H level or an L level. When the setdrn signal and the resdrn signal due to the dV/dt noise occur at timings different by a certain high amount, then such a malfunction occurs that undesirably determines the status of the latch circuit 22 depending on a subsequently-outputted false output signal. The malfunction due to the dV/dt noise leads to the breakage due to the short-circuiting of the half-bridge circuit, thus requiring the malfunction resistance against the dV/dt noise. In the case of the circuits shown in FIG. 1 and FIG. 2, the latch malfunction protection circuit 21 performing a filter operation was provided at the former stage of the latch circuit 22 in order to prevent the malfunction due to the dV/dt noise as described above.

The dV/dt noise is caused not only by the noise due to the ON/OFF of the level-shift transistor 25 and 26 but also by the external noise from lightning surge or noise of other devices. In the case of the conventional level-shift circuits shown in FIG. 1 and FIG. 2, when the dV/dt noise is caused only by the ON/OFF, the influence by the noise to be caused due to the ON/OFF could be predicted at a certain level, thus preventing a malfunction by adjusting the threshold value of the latch mal function protection circuit 21. However, when the dV/dt noise is caused not only by the noise due to the ON/OFF but also by external noise, a malfunction could not be predicted because the influence by the external noise could not be predicted. Furthermore, in the case of the circuits shown in FIG. 1 and FIG. 2, a disadvantage of an increased circuit area was caused by an attempt to improve the function of the latch malfunction protection circuit 21 so as to be further able to cope with external noise.

The present invention has been made in view of the above. It is an objective of the present invention to provide a level-shift circuit to prevent the noise due to the ON/OFF of a level-shift transistor and a malfunction (logic inversion) due to dV/dt noise caused by external noise.

Solution to Problem

In order to solve the above-described problem, one embodiment of the level-shift circuit of the present invention provides a level-shift circuit for transmitting a signal from a primary potential side to a secondary potential side different from the primary side potential system, comprising: a first serial circuit including a first resistance serially-connected to a first switching element, wherein the input of the first switching element is a first input signal for turning ON or OFF the first switching element, and a connecting point of the first resistance and the first switching element acts as an output terminal, a second serial circuit including a second resistance serially-connected to a second switching element, wherein the input of the second switching element a second input signal for controlling the ON/OFF of the second switching element, a connecting point of the second resistance and the second switching element acts as an output terminal, and the first input signal and the second input signal are not simultaneously turned ON, a latch circuit for changing a status depending on the output of the output terminal of the first serial circuit and the output of the output terminal of the second serial circuit, and a first capacitor connected between the output terminal of the first serial circuit and the output terminal of the second serial circuit.

Advantageous Effects of Invention

The level-shift circuit according to the present invention can suppress the malfunction caused by the noise due to the ON/OFF of the level-shift transistor and the dV/dt noise due to external noise.

Furthermore, according to the present invention, the capacitor provided between two serial circuits eliminates the need to improve the function of a latch malfunction protection circuit. Thus, the latch malfunction protection circuit area can be designed to have a small size, thus providing an entirely-compact circuit apparatus.

DESCRIPTION OF EMBODIMENTS

Example 1

Figure 3:
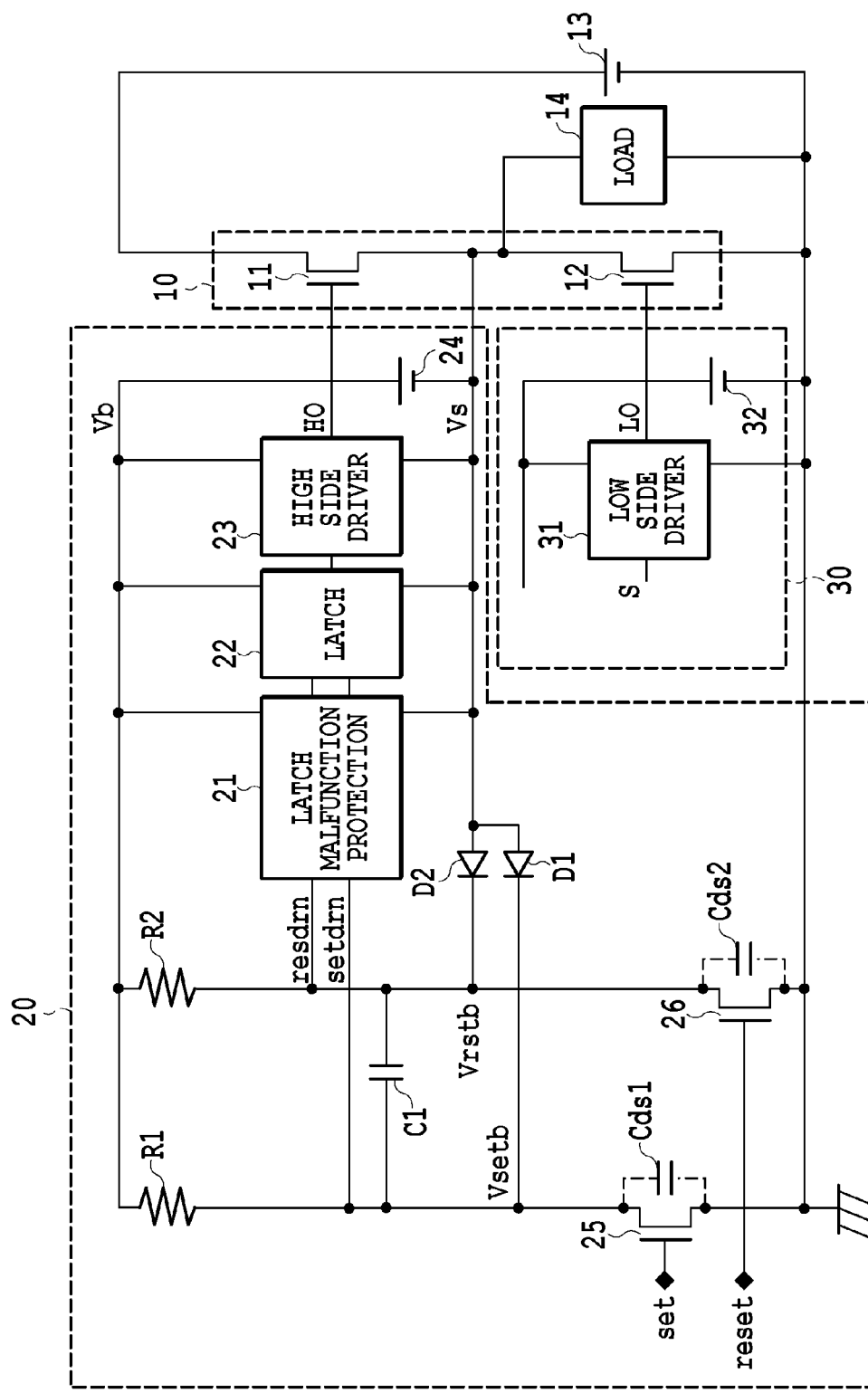
FIG. 3 illustrates a level up shift circuit according to Example 1 of the present invention.

FIG. 3 illustrates a configuration example of the level up shift circuit according to Example 1 of the present invention. In the level up shift circuit shown in FIG. 3, a capacitor C1 is provided between a first serial circuit composed of a resistance R1 and a first the level-shift transistor 25, and a second serial circuit composed of resistance R2 and a second the level-shift transistor 26. Specifically, the capacitor C1 is connected between the connecting point between the resistance R1 and the drain terminal of the first the level-shift transistor 25 (the first serial circuit output terminal), and the connecting point between the resistance R2 and the drain terminal of the second the level-shift transistor 26 (the second serial circuit output terminal). The circuit illustrated in FIG. 3 is different from the circuit shown in FIG. 1 in having the capacitor C1. Thus, configurations similar to those of the circuit shown in FIG. 1 will not be further described.

As described above, it has been known that the malfunction of the level-shift circuit is caused by an operation difference of two serial circuits to a change of the potential Vs. As an example, a case will be considered where the malfunction due to the dV/dt noise occurs in the status where there is an element variation (e.g., the variation of the parasitic capacitances Cds1 and Cds2 of the level-shift transistors 25 and 26). When the variation of the output point Vs of the half-bridge circuit (=high side reference potential) due to the switching operation is transmitted to the first and second serial circuits via the diodes D1 and D2 to cause the setdrn signal and the resdrn signal to include therein the dV/dt noise, then the parasitic capacitances Cds1 and Cds2 have an influence on the waveform of the generated dV/dt noise. Thus, the difference between the parasitic capacitances Cds1 and Cds2 causes a difference in the phase or amplitude of the two setdrn and resdrn signals, thus causing the malfunction due to this difference.

In the present invention, for the purpose of reducing a difference in the phase or amplitude of the two setdrn and resdrn signals, the capacitor C1 is coupled between two serial circuits. As a result, when there is a potential variation between the setdrn signal and the resdrn signal due to the vibration of the setdrn signal and the resdrn signal (e.g., ringing), the capacitor C1 causes the two setdrn signal and resdrn signals to be coupled so as to reduce the impedance therebetween. Thus, the potential error between the setdrn signal and the resdrn signal can be reduced. This can consequently prevent the malfunction caused by the noise due to the ON/OFF of the level-shift transistor and the dV/dt noise due to external noise. Since the first and second serial circuits do not have therebetween a DC coupling, there is no operational problem.

Figure 1:
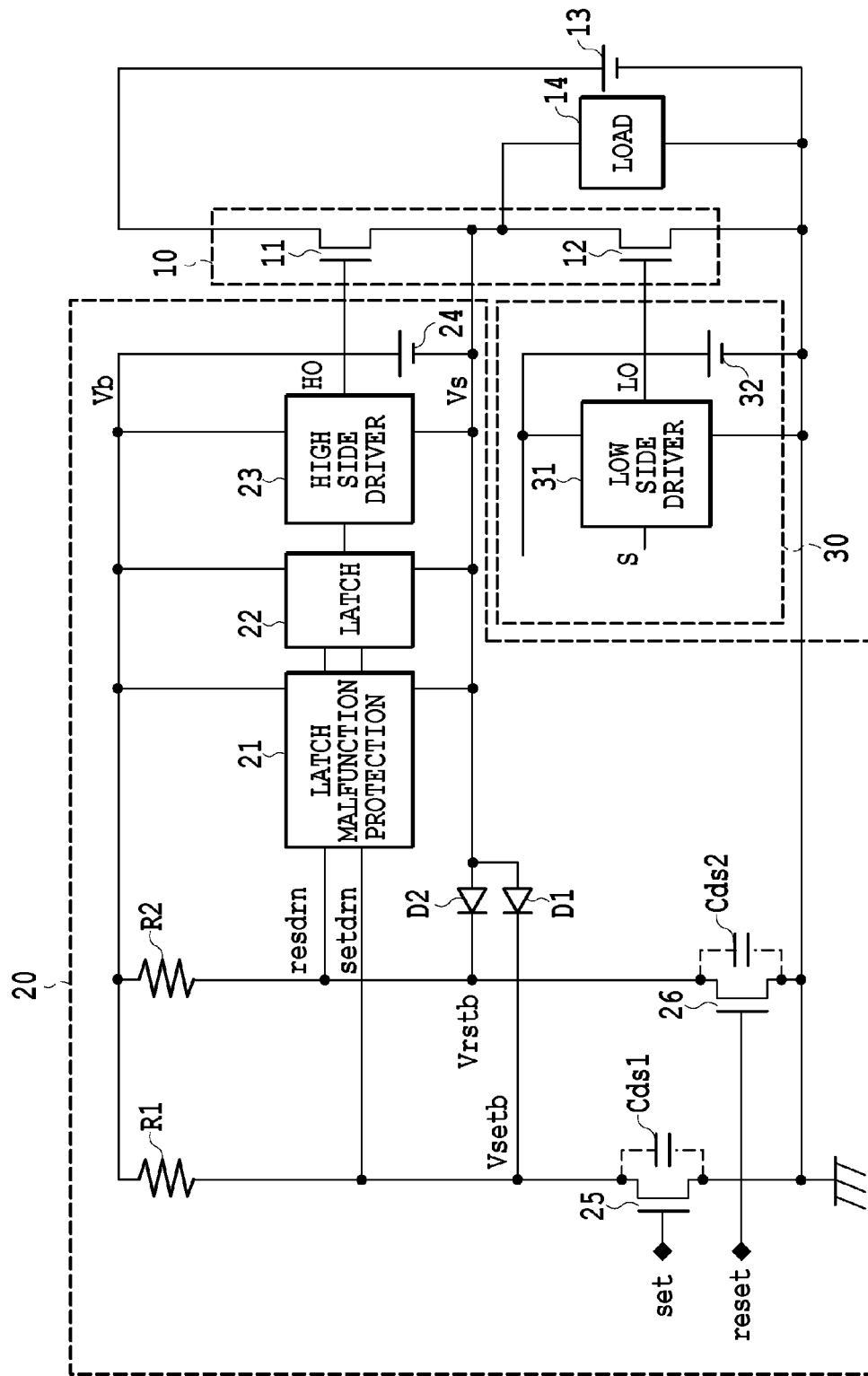
FIG. 1 illustrates a conventional level-shift circuit disclosed in Patent Literature 1.
Figure 2:
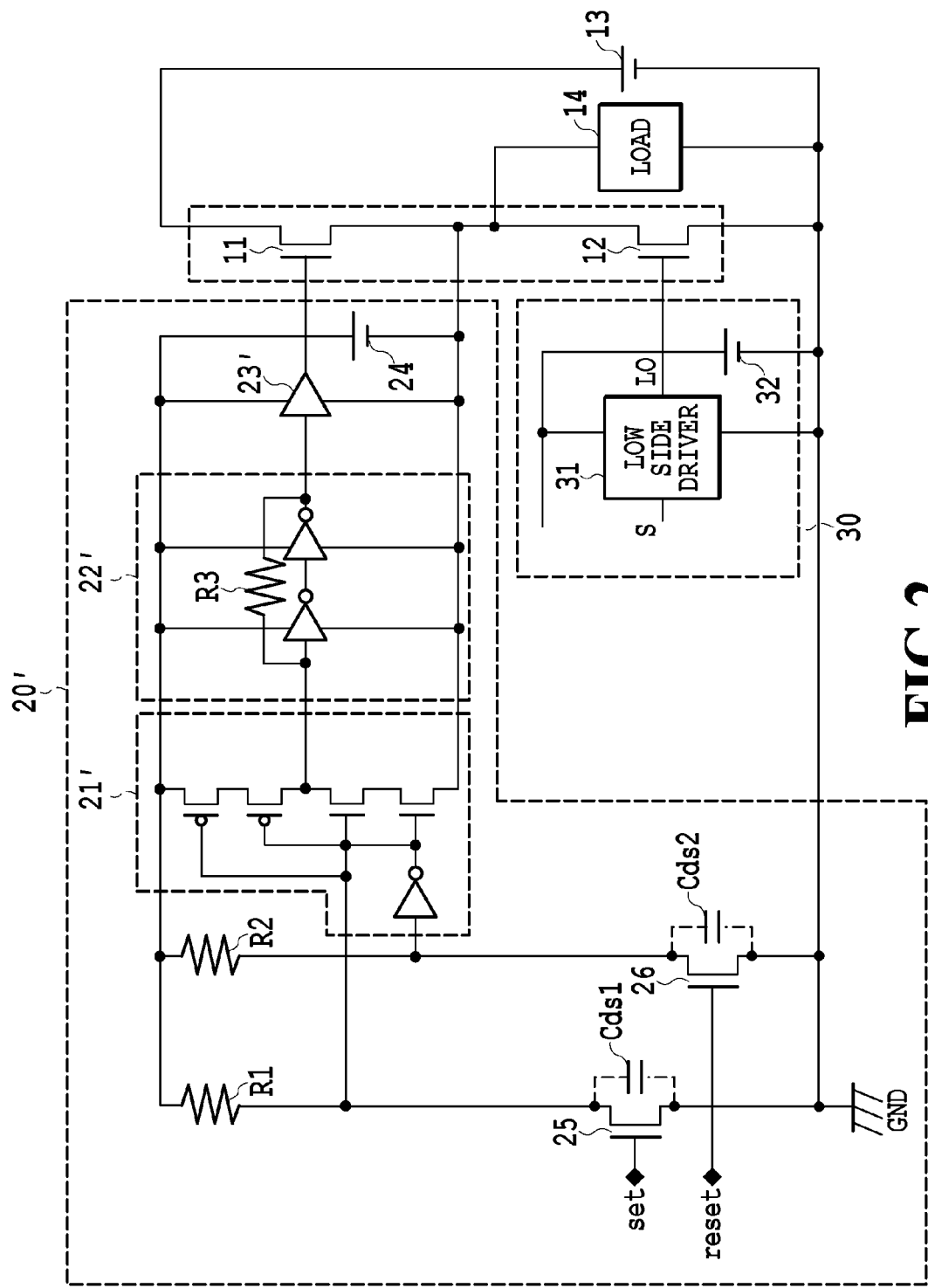
FIG. 2 illustrates a conventional level-shift circuit disclosed in Patent Literature 2.
Figure 4A:
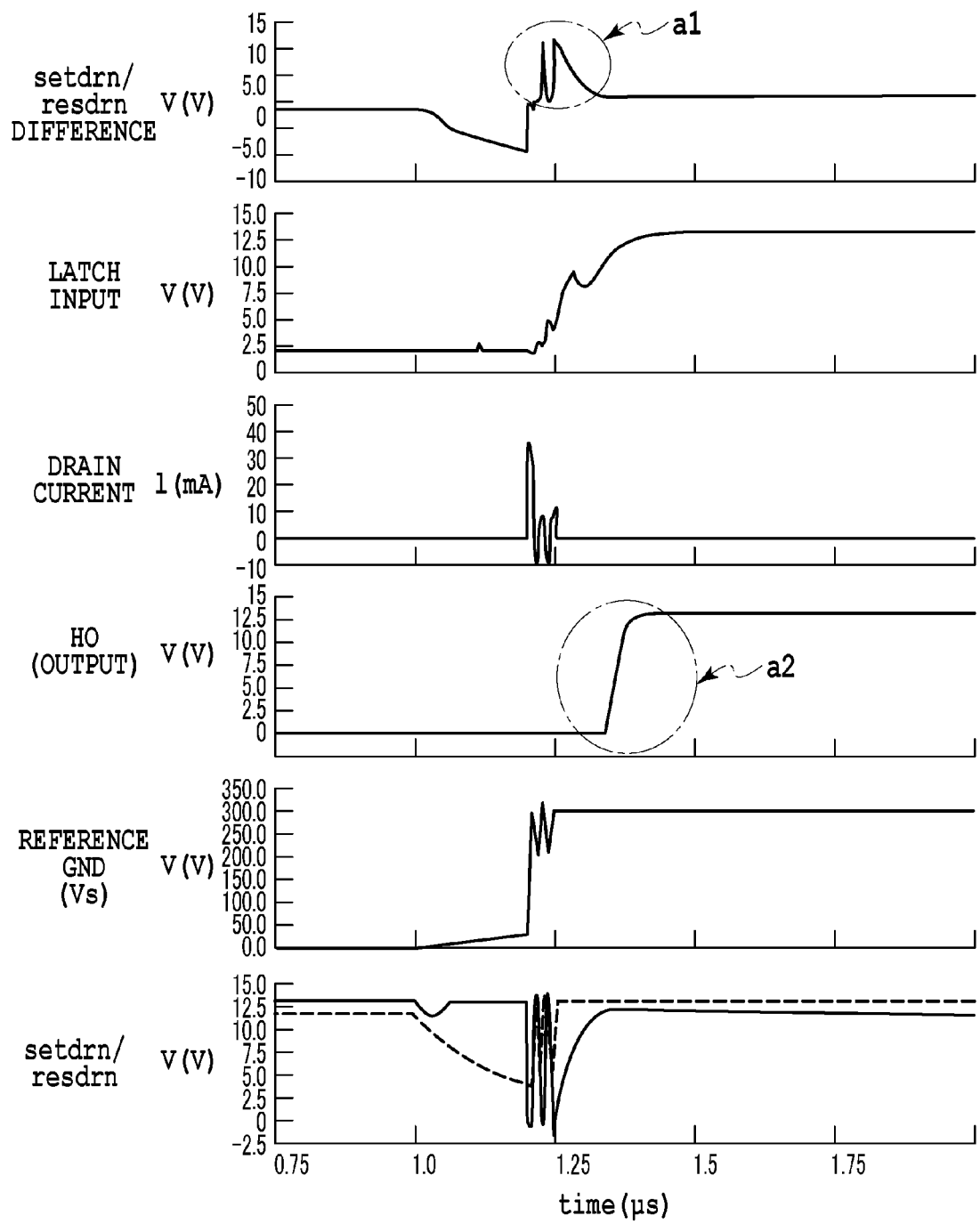
FIG. 4A is a time chart illustrating the operation waveforms of the level-shift circuit.
Figure 4B:
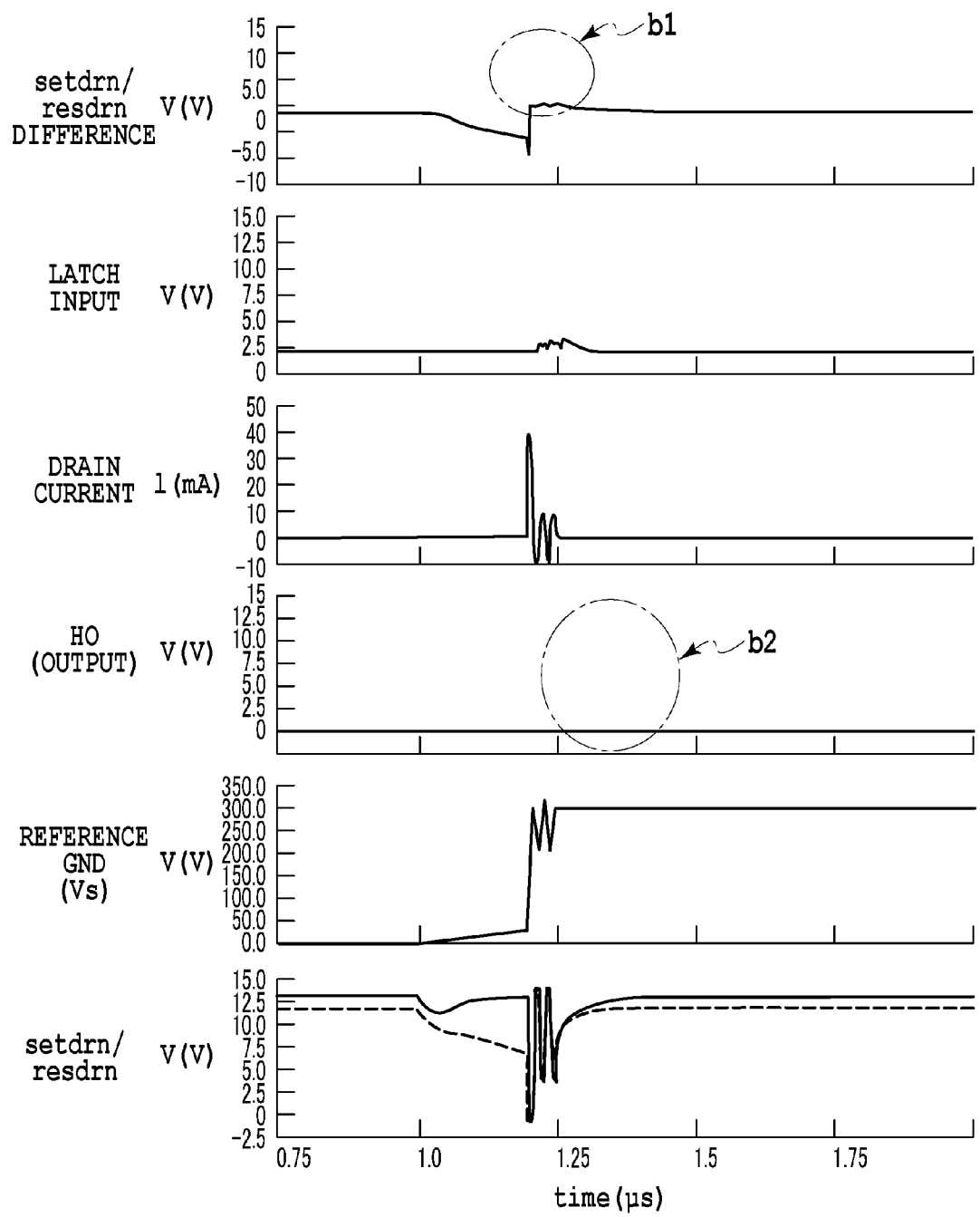
FIG. 4B is a time chart illustrating the operation waveforms of the level-shift circuit.

FIG. 4A illustrates a time chart of the operation waveform of a level-shift circuit according to a conventional configuration as shown in FIG. 1 in which no capacitor is provided between serial circuits. FIG. 4B illustrates a time chart of the operation waveform of the level-shift circuit according to Example 1 of the present invention. As shown in the graph of the reference GND (Vs) of FIGS. 4A and B, when noise due to the ON/OFF of the level-shift transistor or external noise is caused, then, in a conventional level-shift circuit having no capacitive coupling, a significant variation a1 is caused in the difference between the setdrn signal and the resdrn signal as shown in FIG. 4A, causing a malfunction a2 where the signal HO changes from the L level to the H level. On the other hand, the level-shift circuit according to the present invention having capacitive coupling suppresses the variation b1 in the difference between the setdrn signal and the resdrn signal as shown in FIG. 4B. Thus, the level-shift circuit according to the present invention maintains the signal HO at the L level, thus suppressing the malfunction b2.

As described above, the present invention can prevent the malfunction caused by the noise due to the ON/OFF of the level-shift transistor and the dV/dt noise due to the external noise. Furthermore, according to the present invention, the provision of the capacitor C1 eliminates the need to improve the function of the latch malfunction protection circuit. This consequently provides a latch malfunction protection circuit area having a smaller design, thus providing an entirely-compact circuit apparatus.

Example 2

Figure 5:
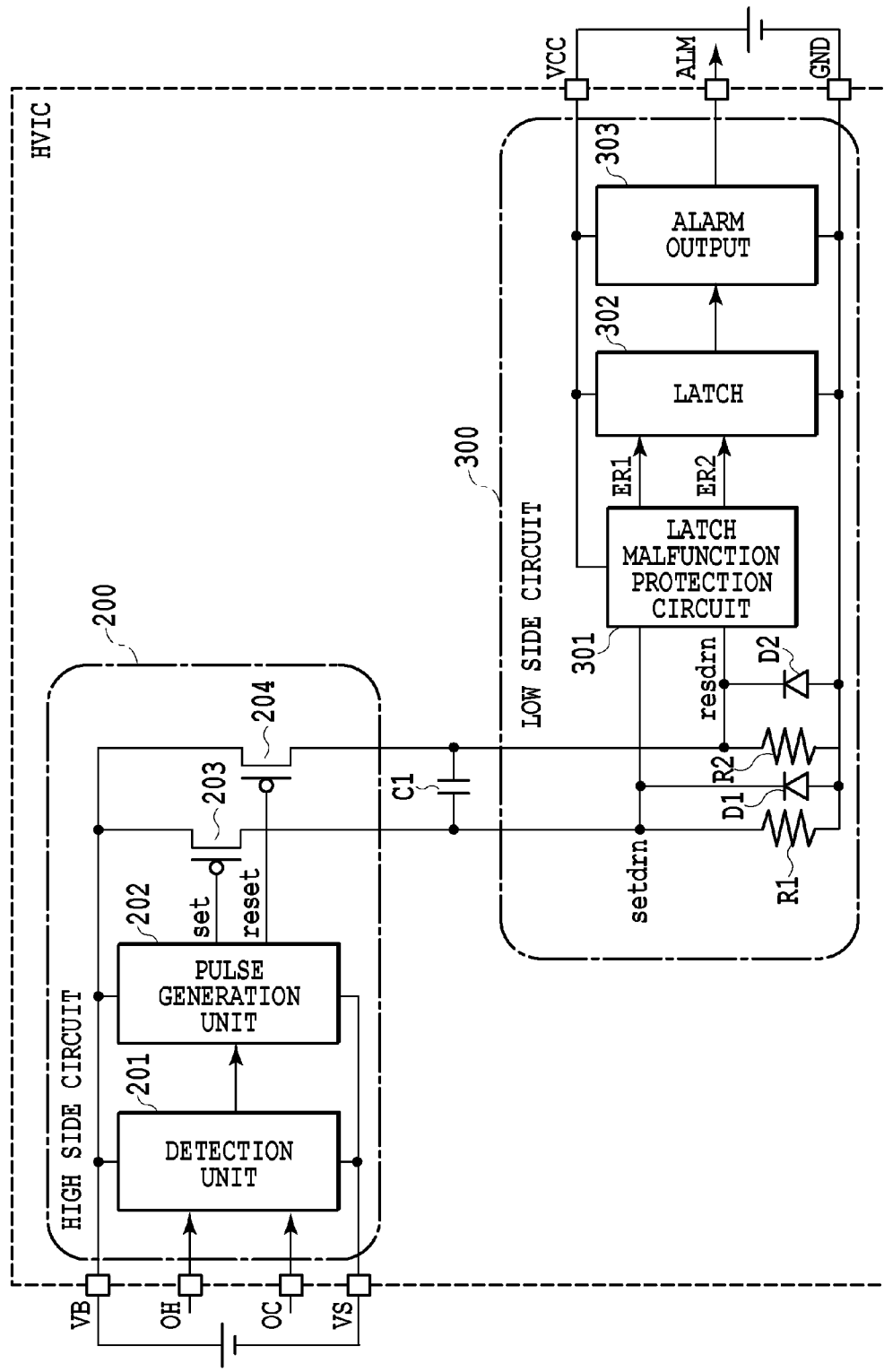
FIG. 5 illustrates the level down shift circuit according to Example 2 of the present invention.

FIG. 5 illustrates the configuration of the level down shift circuit according to Example 2 of the present invention. FIG. 5 illustrates the level down shift circuit including the capacitor C1 provided over a high side circuit 200 and a low side circuit 300.

The high side circuit 200 includes a detection unit 201, a pulse generation unit 202, and level-shift transistors 203 and 204. The low side circuit 300 includes a latch malfunction protection circuit 301, a latch circuit 302, an alarm output circuit 303, resistances R1 and R2, and diodes D1 and D2. A P channel-type semiconductor switching element can be used for the level-shift transistors 203 and 204.

In the high side circuit 200 of the level down shift circuit shown in FIG. 5, the detection unit 201 detects the excess current, voltage decrease, and overheating of a high potential-side switching element to output a detection signal. In response to the signal outputted from the detection unit 201, the pulse generation unit 202 generates a pulse and outputs the set signal and reset signal to the level-shift transistors 203 and 204, respectively.

In the low side circuit 300 of the level down shift circuit shown in FIG. 5, the latch malfunction protection circuit 301 inputs the setdrn signal and the resdrn signal and filters out the setdrn signal and the resdrn signal equal to or lower than a predetermined threshold value to output a signal to the latch circuit 302. The alarm output circuit 303 outputs an alarm signal depending on the output of the latch circuit 302.

By the level down shift circuit, the excess current detection, the voltage decrease detection, and the overheating detection results for example of the high potential-side switching element driven by the high side output (HO) can be transmitted to the low side.

As shown in FIG. 5, the capacitor C1 can be provided between a serial circuit consisting of the level-shift transistor 203 and the resistance R1, and a serial circuit consisting of the level-shift transistor 204 and resistance R2 to thereby prevent, the malfunction caused by the noise due to the ON/OFF of the level-shift transistor and the dV/dt noise due to the external noise same as in the level up shift circuit according to Example 1 of the present invention. Furthermore, the entire circuit apparatus can have a compact size.

Example 3

Figure 6:
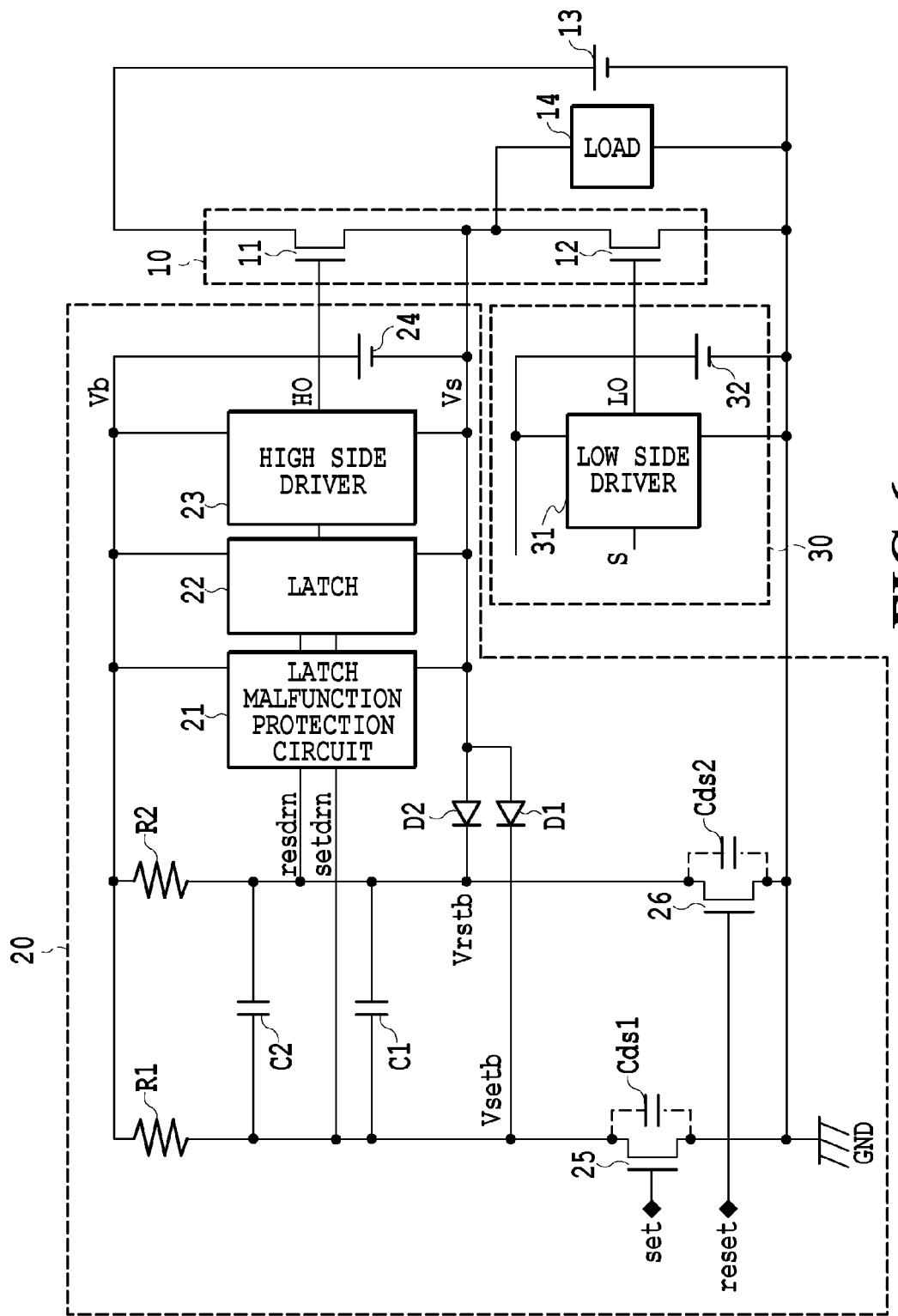
FIG. 6 illustrates the level up shift circuit according to Example 3 of the present invention.

FIG. 6 illustrates a configuration example of the level up shift circuit according to Example 3 of the present invention. As shown in FIG. 6, the level up shift circuit according to Example 3 is configured so that two serial circuits have therebetween the capacitor C1 and the capacitor C2 having a frequency characteristic different from that of the capacitor C1.

As described above, by using a plurality of capacitors having different frequency characteristics, when compared with a case where only one capacitor C1 is added as in Example 1, the frequency region for reducing the impedance can be increased, thus improving the effect of suppressing the malfunction.

Figure 7:
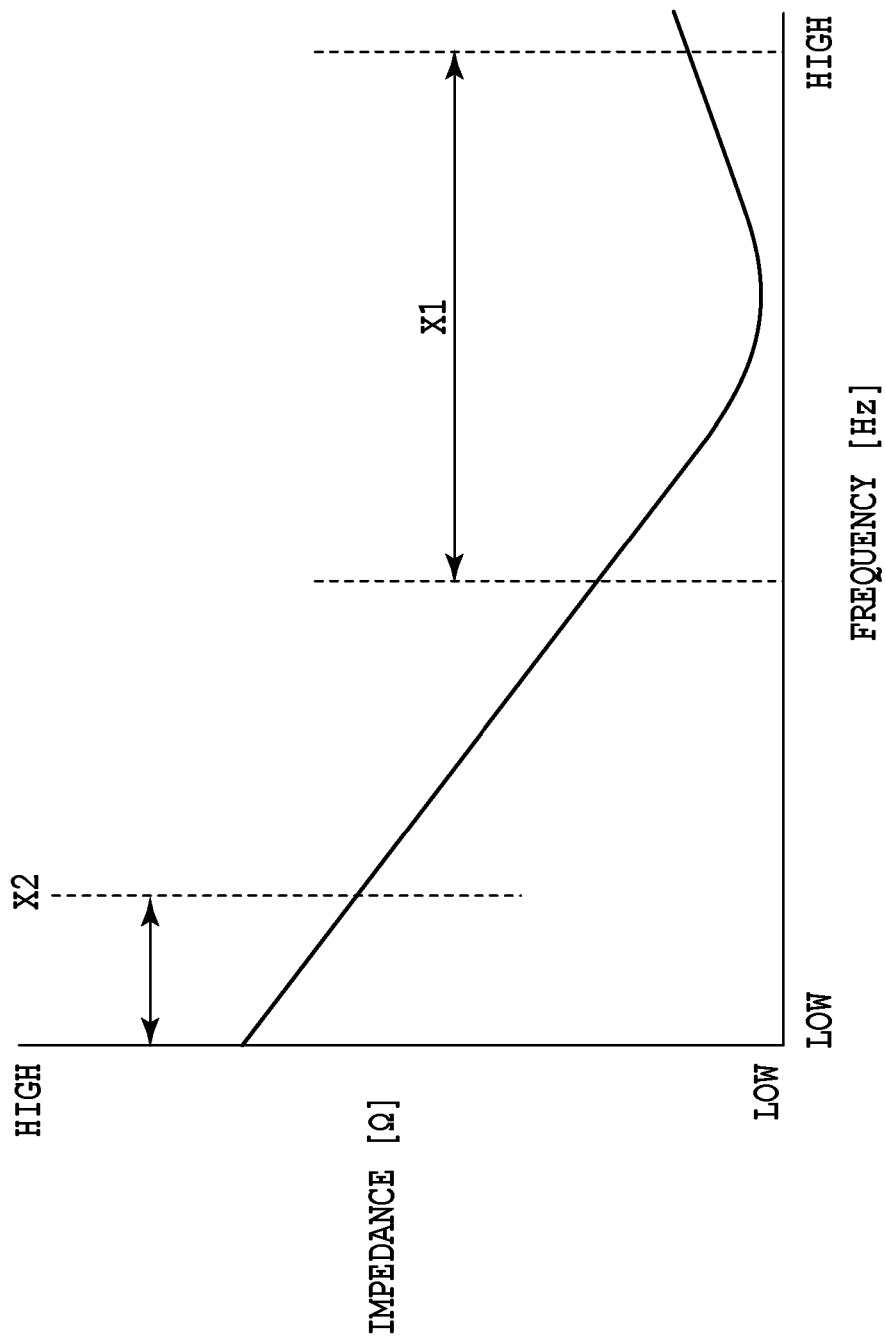
FIG. 7 illustrates the relation between a capacitor frequency characteristic and a dV/dt noise frequency.

FIG. 7 illustrates the relation between the capacitor frequency characteristic and the dV/dt noise frequency region. Here, the region X2 is a constant region. Generally, a capacitive used for the capacitive coupling in a level-shift circuit preferably has a capacity value at which the impedance is decreased at a frequency region causing dV/dt noise (dV/dt noise frequency region X1).

Figure 8:
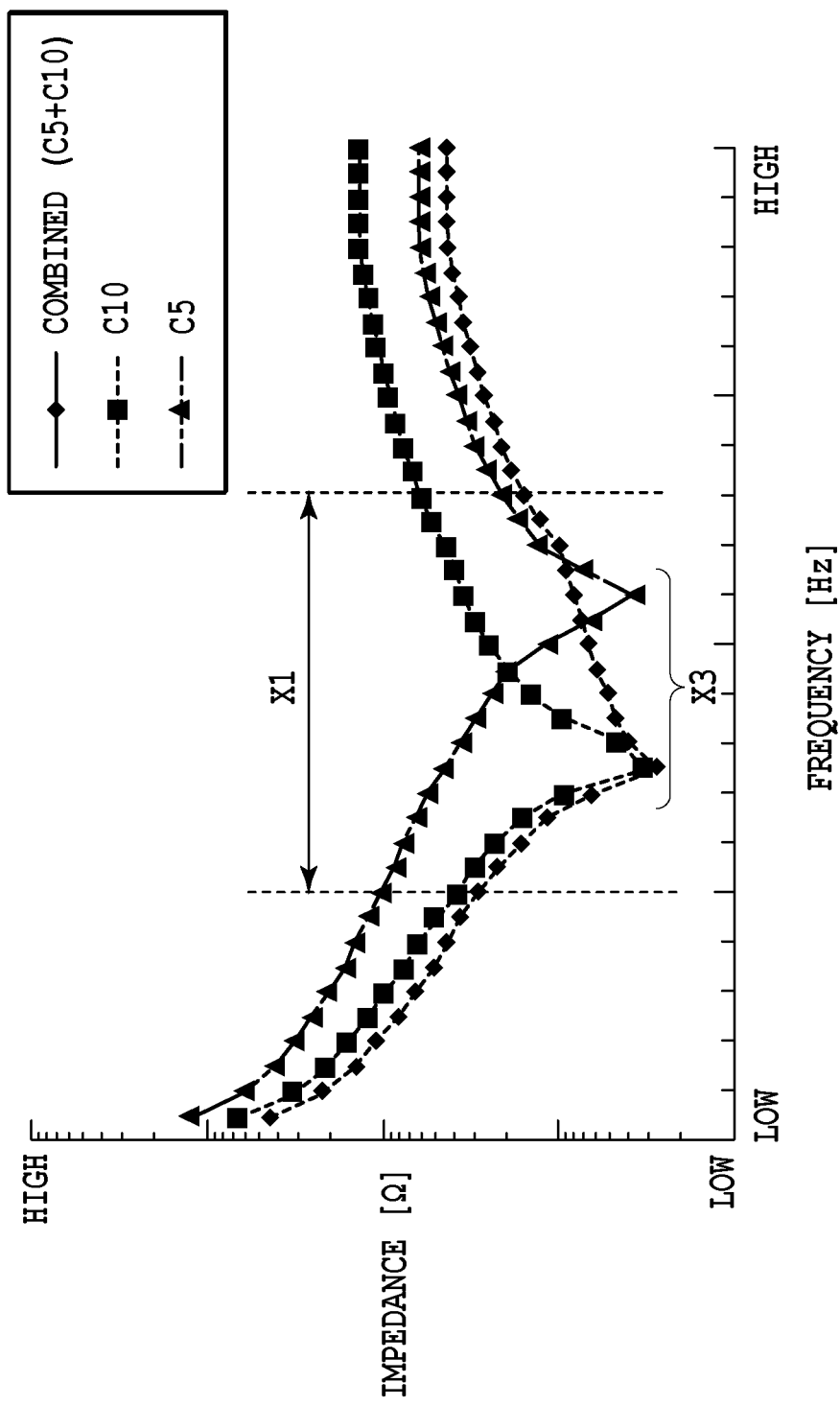
FIG. 8 illustrates the relation between the frequency characteristic and the dV/dt noise frequency when a plurality of different capacitors are added.

FIG. 8 illustrates the relation between the frequency characteristic and the dV/dt noise frequency region when a plurality of different capacitors are added. FIG. 8 illustrates the relation between the frequency characteristic and the dV/dt noise frequency region when capacitors C5 or C10 respectively having different frequency characteristics is used alone and when the combined capacity of the capacitors C5 and C10 is used.

As shown in FIG. 8, when the capacitors C5 or C10 respectively have different frequency characteristics is used alone, an increase of the frequency causes a change of the impedance, at the capacitor self-resonance frequency as a boundary, from the decrease tendency (capacitor characteristic) to the increase tendency (inductance characteristic). Thus, the dV/dt noise frequency region X1 cannot be covered by the range within which the impedance decreases, thus causing a case where the dV/dt noise cannot be handled sufficiently.

When the combined capacity of the capacitors C5 and C10 is used on the other hand, the impedance can be decreased between two self-resonance frequencies. Thus, the range within which the impedance decreases in the dV/dt noise frequency region X3 can be more widely secured when compared with a case where only one capacitor is used, thus more widely handling the dV/dt noise.

In Example 3, a configuration was shown in which two serial circuits had therebetween the two capacitors C1 and C2. However, two or more capacitors can be provided between two level-shift circuits. In Example 3, a configuration was shown in which two serial circuits had therebetween the two capacitors C1 and C2 in the level up shift circuit. However, this configuration also can be applied to a level down shift circuit.

REFERENCE SIGNS LIST

10 Output circuit
11 High potential-side switching element
12 Low potential-side switching element
13, 24, and 32 Power source
14 Load
20 High potential-side driving circuit
21 and 301 Latch malfunction protection circuit
22 and 302 Latch circuit
23 High side driver
25, 26, 203, and 204 Level-shift transistor
30 Low potential-side driving circuit
31 Low side driver
R1 and R2 Resistance
D1 and D2 Diode
C1 and C2 Capacitor
200 High side circuit
201 Detection unit
202 Pulse generation unit
300 Low side circuit
303 Alarm output circuit

The invention claimed is:

1. A level-shift circuit for IC for transmitting a signal from a primary potential side to a secondary potential side different from the primary potential side, comprising:
   a first serial circuit including a first resistance serially-connected to a first switching element, wherein the input of the first switching element is a first input signal for turning ON or OFF the first switching element, and a connecting point of the first resistance and the first switching element acts as an output terminal;
   a second serial circuit including a second resistance serially-connected to a second switching element, wherein the input of the second switching element is a second input signal for controlling the ON/OFF of the second switching element, a connecting point of the second resistance and the second switching element acts as an output terminal, and the first input signal and the second input signal are not simultaneously turned ON;
   a latch circuit for changing a status depending on the output of the output terminal of the first serial circuit and the output of the output terminal of the second serial circuit;
   a first capacitor connected between the output terminal of the first serial circuit and the output terminal of the second serial circuit; and
   one or more additional capacitors parallelly connected to the first capacitor,
   wherein the first capacitor and the one or more additional capacitors have a different frequency characteristic, respectively.

2. The level-shift circuit according to claim 1, wherein:
   both the first switching element and the second switching element are an N channel-type semiconductor switching element or a P channel-type semiconductor switching element.

3. The level-shift circuit according to claim 1, wherein:
   both the first switching element and the second switching element are an N channel-type semiconductor switching element or a P channel-type semiconductor switching element.

* * * * *